(12) United States Patent
Plikat et al.

(10) Patent No.: US 6,661,056 B1
(45) Date of Patent: Dec. 9, 2003

(54) DMOS TRANSISTOR PROTECTED AGAINST POLARITY REVERSAL

(75) Inventors: Robert Plikat, Vaihingen/Enz (DE); Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/168,243

(22) PCT Filed: Nov. 17, 2000

(86) PCT No.: PCT/DE00/04044
§ 371 (c)(1),
(2), (4) Date: Sep. 26, 2002

(87) PCT Pub. No.: WO01/45176
PCT Pub. Date: Jun. 21, 2001

(30) Foreign Application Priority Data

Dec. 18, 1999 (DE) .............................. 199 61 279

(51) Int. Cl.⁷ .............................................. H01L 29/76
(52) U.S. Cl. ................. 257/335; 257/272; 257/287; 257/134; 257/135; 257/173; 257/355
(58) Field of Search ................. 257/335, 337, 257/272, 287, 134, 135, 173, 355

(56) References Cited

U.S. PATENT DOCUMENTS

| 4,101,922 A | | 7/1978 | Tihanyi et al. | |
|---|---|---|---|---|
| 5,438,215 A | | 8/1995 | Tihanyi | |
| 5,767,550 A | * | 6/1998 | Calafut et al. | 257/355 |
| 5,917,203 A | * | 6/1999 | Bhatnagar et al. | 257/139 |
| 6,114,207 A | * | 9/2000 | Okabe et al. | 438/270 |
| 6,118,141 A | * | 9/2000 | Xu et al. | 257/133 |

FOREIGN PATENT DOCUMENTS

| DE | 195 02 731 | | 9/1995 |
|---|---|---|---|
| DE | 4426307 A1 | * | 2/1996 |
| WO | WO-9007794 A1 | * | 7/1990 |
| WO | WO 99/26296 | | 5/1999 |

* cited by examiner

Primary Examiner—Nathan J. Flynn
Assistant Examiner—Remmon R. Fordé
(74) Attorney, Agent, or Firm—Kenyon & Kenyon

(57) ABSTRACT

The present invention relates to a circuit configuration for protecting against polarity reversal of a DMOS transistor.

A charge carrier zone (30) is provided, situated in the drift zone (14) of DMOS transistor (10), made up of individual partial charge carrier zones (32) situated at a distance from one another and connected to one another in a conducting manner, the charge carrier zone (30) having an opposite charge carrier doping from that of the drift zone (14), and being able to be acted upon by a potential that is negative with respect to a potential present at a drain terminal (24) of the DMOS transistor (10), so that a short-circuit current is prevented.

10 Claims, 2 Drawing Sheets

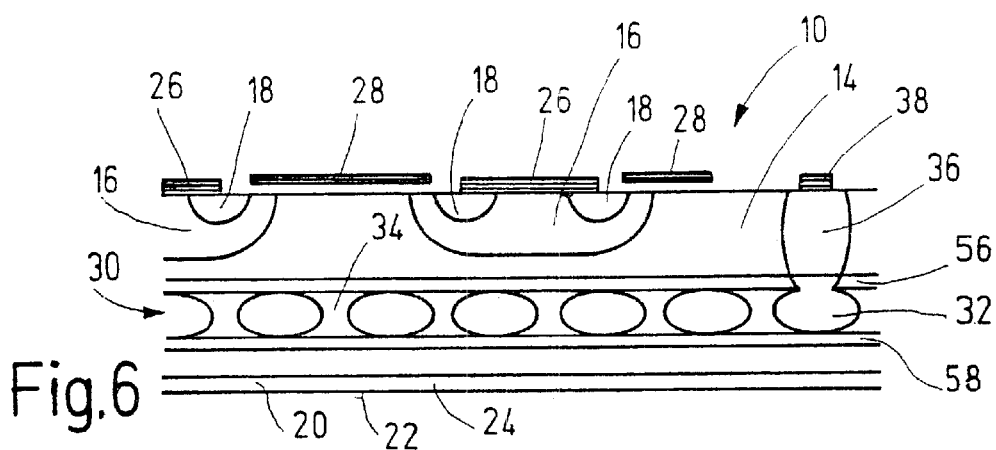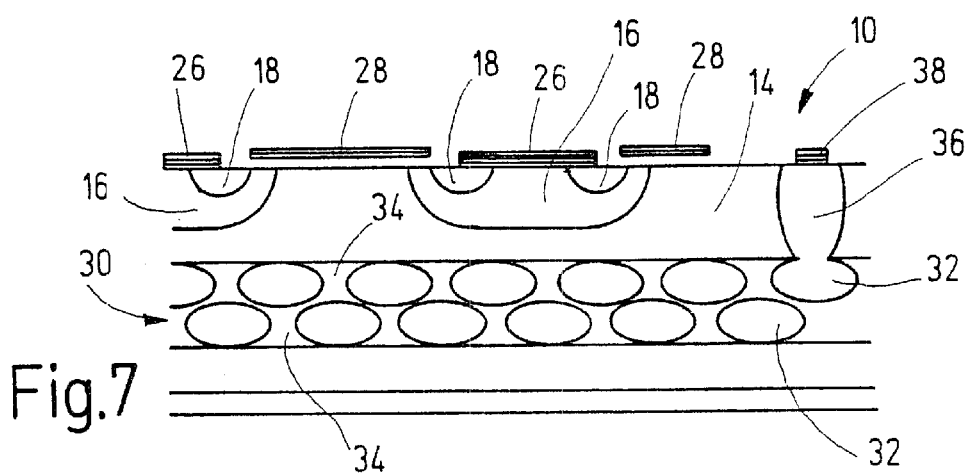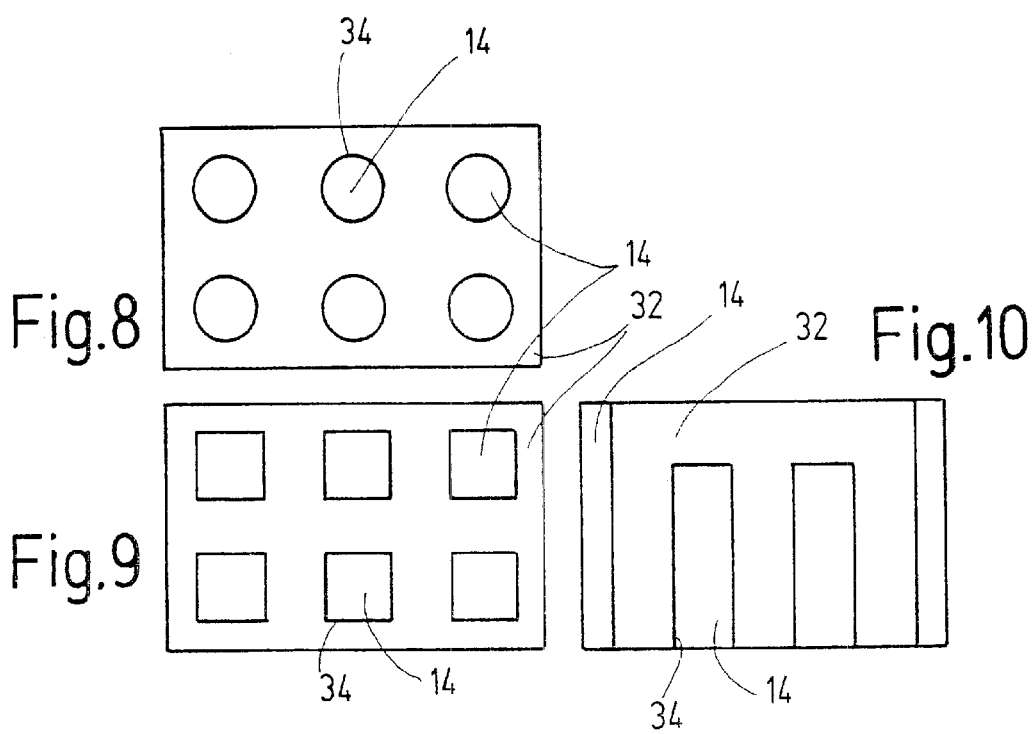

DMOS TRANSISTOR PROTECTED AGAINST POLARITY REVERSAL

The present invention relates to a circuit configuration for protecting against polarity reversal of a DMOS transistor.

BACKGROUND INFORMATION

When DMOS transistors are inserted into circuit configurations in which there are at least two supply voltages available, in case of a fault, for instance a short-circuit, it may happen that a short-circuit current runs backwards via the DMOS transistor. Especially in the case of large short-circuit currents, this can lead to the destruction of the DMOS transistor or to a voltage supply arranged in front of it.

A circuit configuration is known from DE 195 02 731 C2 in which a polarity-reversal protecting DMOS transistor is allocated to a DMOS transistor that is in series with a load circuit to be switched. In this case, the transistors are connected antiserially and monolithically integrated in a common substrate. Because both the switching transistor and the polarity reversal protection transistor are integrated in a common substrate having a certain charge carrier doping, both transistors have the same resistance to blocking. This resistance to blocking is selected so that the maximum voltage possible may be blocked. Besides the high area requirement, it is disadvantageous in this circuit configuration that the high resistance to blocking of the switching transistor leads to a correspondingly high forward resistance in the conducting case, which leads to a voltage drop that is undesirable per se.

SUMMARY OF THE INVENTION

By contrast, the circuit configuration according to the present invention, having the features recited in claim 1, offers the advantage that protection against polarity reversal of the DMOS transistor is achieved in a simple manner. A reverse blocking ability of the DMOS transistor is advantageously achieved, essentially without additional area requirement, by having a charge carrier zone situated in the drift zone of the DMOS transistor that is made up of individual charge carriers at a distance from one another and conductively connected to one another, the charge carrier having an opposite charge carrier doping compared to the drift zone, and being able to have a potential applied to it which is negative to a potential that may be connected at the drain terminal of the DMOS transistor. By application to the buried charge carrier, forming a JFET structure of a negative potential compared to the drain potential, the pn junction between the drain region and the charge carrier situated in the drain region is polarized for blocking, so that a so-called reverse current, such as in the case of a short-circuit, is pinched off. Thus the polarity reversal protection of the entire circuit configuration is ensured.

Further preferred embodiments of the present invention follow from the remaining features specified in the subclaims.

BRIEF DESCRIPTION OF THE DRAWINGS

The present invention is explained below in detail in exemplary embodiments, using the corresponding drawings. The figures show:

FIG. 6 a circuit configuration according to the present invention in a second exemplary embodiment;

FIG. 7 a circuit configuration according to the present invention in a third exemplary embodiment;

FIGS. 8 to 10 various layouts of the integrated charge carrier zones according to the present invention.

DESCRIPTION OF THE EXEMPLARY EMBODIMENTS

Figure 1:
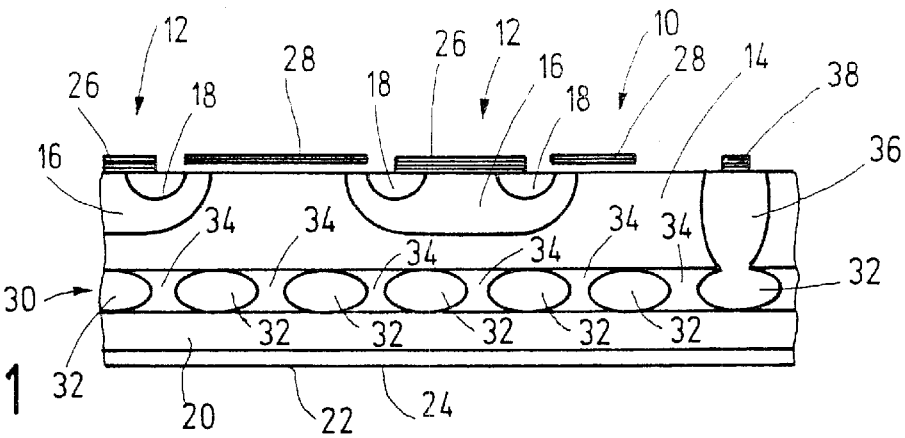
FIG. 1 a schematic view of the circuit configuration according to the present invention.

FIG. 1 shows a DMOS transistor 10. The DMOS transistor is shown in a section in the region of two control heads 12.

The DMOS transistor includes a drift zone 14 having a charge carrier doping (let us say n-doped). Charge carrier zones 16, having a charge carrier doping (p-doped in the example) opposite to the first charge carrier doping, are integrated into drift zone 14. Into charge carrier zones 16, additional charge carrier zones 18 are integrated which have the same charge carrier doping as drift zone 14 ($n^+$-doped in the example). Drift zone 14 is situated on a substrate region 20, which is equivalent to the same charge carrier type as drift zone 14, but has a higher doping ($n^+$-doped in the example). Substrate region 20 is furnished with a metallization 22. The metallization forms a drain terminal 24 of DMOS transistor 10. Charge carrier zones 16 and 18 are connected in an electrically conducting manner via metallizations 26. Metallizations 26 form surce connections of DMOS transistor 10. A layer 28, preferably made of polysilicon, is situated above an oxide (not shown) on drift zone 14, and forms the gate of DMOS transistor 10.

Source connection 26 of DMOS transistor 10 is connected to an electric load (not shown) which lies on the other side, grounded. A supply voltage for the electric load is present at the drain terminal.

Into drift zone 14 a charge carrier zone 30 is integrated which is composed of individual partial charge carrier zones 32, at a distance from one another. Partial charge carrier zones 32 are connected to one another in an electrically conducting manner. Between the individual partial charge carrier zones 32 there remain sections (gaps) 34 of drift zone 14, so that partial charge carrier zones 32 form a grid-like structure over the area of drift zone 14. Partial charge carrier zones 32, and thus entire charge carrier zone 30, have a charge carrier doping opposite to that of drift zone 14 (thus, p-doped in the example). Charge carrier zone 30 is connected to a metallization 38 in an electrically conducting manner via a vertical charge carrier zone 36. Charge carrier zone 36 has the same doping as charge carrier zone 30. For the purpose of contacting charge carrier zone 30, charge carrier zone 36 is able to bridge drift zone 14 berween metallization 38 and one of the partial charge carrier zones 32, as shown. DMOS transistor 10 shown in FIG. 1 shows the following function:

If the electrical load connected to source connection 26 is to be connected to the supply voltage, this occurs by activating gate connection 28. Thereby DMOS transistor 10 carries out its switching function known per se. In the case of a fault, that is, if because of a short-circuit there is a higher voltage at source connection 26 than at drain connection 24, this is recognized by a switching logic (not shown in greater detail). Thereupon metallization 38 has a potential applied to it that is negative compared to drain terminal 24. Thereby, the pn junctions between partial charge carrier zones 32 and drift zone 14 are polarized for blocking, so that a reverse current flowing from source connection 36 to drain terminal 24 is pinched off. The magnitude of the potential applied to metallization 38 by the switching logic is selected so that a charge carrier injection from charge carrier zone 30 does not take place. The polarization for blocking of the pn junctions between partial charge carrier zones 32 and drift zone 14 in the case of a fault is decisive.

The production process of the buried JFET structures up to the usual further processing of the DMOS structures of DMOS transistor 10 is made clear schematically in the light of FIGS. 2 to 5.

Figure 2:
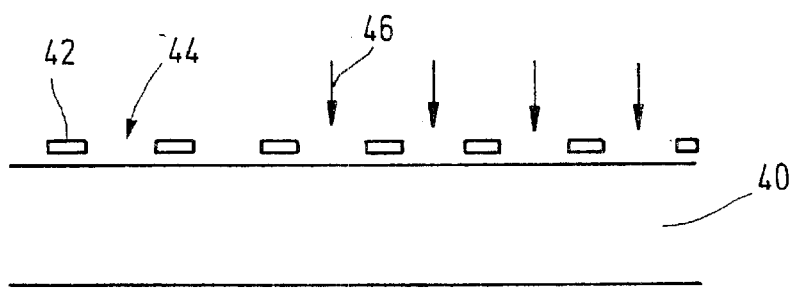
FIGS. 2 to 5 manufacturing steps for attaining the circuit configuration according to the present invention as in FIG. 1.
Figure 3:
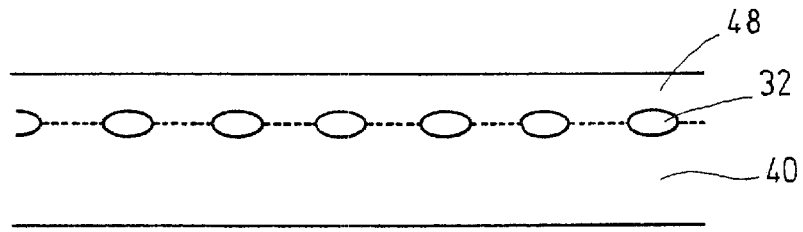

First of all, as shown in FIG. 2, a masking 42 is produced on an initial wafer 40, which is made of an $n^+$-doped substrate and a thin (usually a few $\mu$m thick) n-doped layer, which later accommodates portions of zones 34 and 32 (later drift zone 14), which masking has mask openings 44 in the region of later partial charge carrier zone 32. Subsequently, an ion implantation 46 is carried out with p-doped ions which lead to the formation of partial charge carrier zones 32. FIG. 3 shows the implantation of p-doped partial charge carrier zone 32 in substrate 40. After that, an n-doped monocrystalline layer 48 is epitaxially grown, so that the partial charge carrier zones 32 are situated completely buried in the later drift zone 14.

Figure 4:
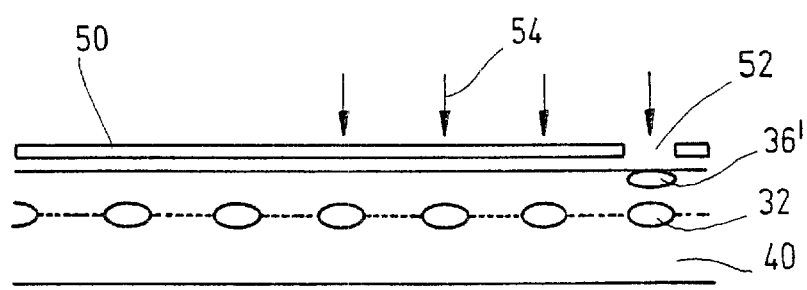

Following that, another masking 50 is performed, as is made clear in FIG. 4, which has a mask opening 52 in the region of the later charge carrier zone 36. Then there follows an ion implantation 54, again with p-doped ions, so that the development of a preliminary partial charge carrier zone 36' in the region of the mask opening 52 is achieved. Subsequently, as is made clear in FIG. 5, the epitaxial growth of the n-doped monocrystalline layer 48 is continued until the final thickness of drift zone 14 is attained.

The implantation of the p-doped partial charge carrier zone 32 in its structural array is done in such a way that, when a negative blocking voltage is applied, as already explained in connection with FIG. 1, the reverse current path between source connection 12 and drain terminal 24 is blocked. In the forward case, that is, in the normal switching case of DMOS transistor 10, in order to set optimal forward properties, an adjustment of partial charge carrier zones 32 to MOS control heads (charge carrier zones 16, 18) of DMOS transistor 10 is provided in such a way that the current path setting in is executed as low-resistance as possible.

For the epitaxial growth of layer 48, the n-doping is selected so that both for the later MOS control heads of transistor 10 and for partial charge carrier zones 32 a desired blocking voltage is reached. This blocking voltage is set by the layer thickness and the doping of layer 48.

Figure 5:
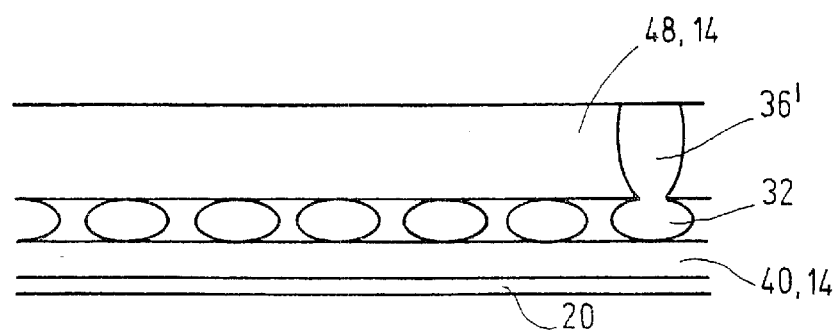

After the intermediate step illustrated in FIG. 5, for producing the DMOS transistor, there follows, using known standard manufacturing method steps, diffusion of charge carrier zones 16 and 18, and metallizations 22, 26 and 38 are deposited, and the polysilicon deposits of gate connections 28 are deposited. At the same time, additional circuit components (not shown) are generated, such as a driving circuit, the logic already mentioned for recognizing a fault condition and the activation of metallization 38.

On account of the temperature influences (for controlling the concentration profiles of the implanted charge carrier) which arise during these standard process steps, an outdiffusion of partial charge carrier zones 32 or charge carrier zones 36 to their final size takes place, so that the distances between partial charge carrier zones 32 set in, and the contacting of the one partial charge carrier zone 32 to metallization 38 via partial charge carrier zone 36 is the result.

FIG. 6 shows a further embodiment variant of DMOS transistor 10. Parts that are the same as in FIG. 1 are provided with identical reference numerals and are not explained again. The difference from the exemplary embodiment shown in FIG. 1 is that a charge carrier layer 56 or 58, respectively, was structured above or below charge carrier zone 30 within drift zone 14. Charge carrier layer 56 and 58 are of the same charge carrier type as drift zone 14, but, in contrast to it, are more highly doped (according to that, n-doped in the example).

In the exemplary embodiment shown in FIG. 7, charge carrier zone 30 is made up of partial charge carrier zones 32 situated in two planes. In this context, partial charge carrier zones 32 are arranged so as to be offset. That means, that a partial charge carrier zone of the plane lying below or above is in each case allocated to a gap 34 between two partial charge carrier zones 32 and a plane. Zones 32 situated in both planes are electrically connected to one another so that they can be activated via common gate 38. This makes possible an especially effective pinch-off of the reverse current path of DMOS transistor 10 in the fault case.

Finally, FIGS. 8 to 10 show various layout variants of the structuring of partial charge carrier zones 32 within drift zone 14. According to FIG. 8, gaps 34 of drift zone 14 between partial charge carrier zones 32 are formed essentially round, whereas gaps 34 according to the exemplary embodiment shown in FIG. 9 are formed essentially square. According to the exemplary embodiment shown in FIG. 10, it may also be provided that partial charge carrier zones 32 form a comb-like structure, which results in strip-shaped gaps 34. In general, gaps 34 may have the shape of any closed polygon.

What is claimed is:

1. A circuit configuration for polarity reversal protection of a DMOS transistor, comprising:
    a drain terminal of the DMOS transistor;
    a drift zone of the DMOS transistor; and
    a charge carrier zone arranged in the drift zone, the charge carrier zone including individual partial charge carrier zones arranged at a distance to one another and connected to one another in a conducting manner, the charge carrier zone having an opposite charge carrier doping to that of the drift zone at locations of the partial charge carrier zones;
    wherein for polarity reversal protection of the DMOS transistor, the charge carrier zone is configured to be acted upon, at the locations of the partial charge carrier zones, with a potential relative to a potential present at the drain terminal so that a blocking polarity forms between the partial charge carrier zones and the drift zone.

2. The circuit configuration according to claim 1, wherein the partial charge carrier zones are arranged as a grid and enclose gaps in the drift zone.

3. The circuit configuration according to claim 1, further comprising:
    a vertical charge carrier zone; and
    a metallization connected to the carrier zone via the vertical charge carrier zone.

4. The circuit configuration according to claim 1, further comprising two charge carrier layers having a same-charge carrier type as the drift zone and more highly doped than the drift zone, the charge carrier zone arranged between the two charge carrier layers.

5. The circuit configuration according to claim 1, wherein the charge carrier zone includes the partial charge carrier zones are arranged in two planes.

6. The circuit configuration according to claim 5, wherein the partial charge carrier zones of the two planes are positioned offset to one another with respect to gaps.

7. The circuit configuration according to claim 1, further comprising round gaps arranged between the partial charge carrier zones.

8. The circuit configuration according to claim 1, further comprising square gaps arranged between the partial charge carrier zones.

9. The circuit configuration according to claim 1, further comprising strip-shaped gaps arranged between the partial charge carrier zones.

10. The circuit configuration according to claim 1, further comprising gaps arranged between the partial charge carrier zones having a shape of a closed polygon.

* * * * *